United States Patent
Boll et al.

Patent Number: 5,623,194
Date of Patent: Apr. 22, 1997

[54] APPARATUS FOR MONITORING AND CONTROLLING CHARGING OF A BATTERY FOR A HYBRID OR ELECTRIC VEHICLE

[75] Inventors: Wolf Boll, Weinstadt; Günther Knörzer, Sachsenheim; Leopold Mikulic, Aichwald, all of Germany

[73] Assignee: Mercedes-Benz AG, Germany

[21] Appl. No.: 364,209

[22] Filed: Dec. 27, 1994

[30] Foreign Application Priority Data

Dec. 24, 1993 [DE] Germany .......................... 43 44 368.0

[51] Int. Cl.$^6$ .................................................. H01M 10/44
[52] U.S. Cl. ................................... 320/15; 320/22; 320/39
[58] Field of Search ............................... 320/2, 5, 30, 35, 320/39, 48, 22

[56] References Cited

U.S. PATENT DOCUMENTS

| | | | |
|---|---|---|---|
| 4,435,675 | 3/1984 | Adams | 320/22 |
| 4,558,281 | 12/1985 | Codd et al. | 320/48 X |
| 5,212,431 | 5/1993 | Origuchi et al. | 180/65.4 X |

FOREIGN PATENT DOCUMENTS

| | | |
|---|---|---|
| 3220152A1 | 12/1982 | Germany . |
| 3142038A1 | 5/1983 | Germany . |
| 3321045A1 | 12/1983 | Germany . |
| 4116899A1 | 11/1991 | Germany . |

OTHER PUBLICATIONS

French Search Report dated Mar. 13, 1996.

*Primary Examiner*—Edward H. Tso
*Attorney, Agent, or Firm*—Evenson, McKeown, Edwards & Lenahan P.L.L.C.

[57] ABSTRACT

The invention relates to a charge information system to support the operator of an electric vehicle or hybrid vehicle, including the input of desired parameters for charging and operating the vehicle. The charge information system according to the invention comprises an input unit for putting the desired parameters into a computing unit which determines the required remaining charging time and displays it. Defining quantities are, among others, the charging efficiency or the desired range.

15 Claims, 2 Drawing Sheets

APPARATUS FOR MONITORING AND CONTROLLING CHARGING OF A BATTERY FOR A HYBRID OR ELECTRIC VEHICLE

BACKGROUND AND SUMMARY OF THE INVENTION

The present invention relates to a charge information and control system for an electric or hybrid vehicle.

German Patent Document DE 41 16 899 A1 discloses an electric vehicle having a battery which is charged by a generator during the drive. Controls are provided which switch the generator on and off as a function of the charging condition of the battery. During operation, the battery is always charged in such a manner that its capacity will not be used up before the fuel reserves. In this case, the total consumption of battery energy is continuously calculated, and determines when the battery would be run down if the operating conditions remained the same.

German Patent Document DE 31 42 038 A1 discloses an arrangement for determining a remaining driving range of an electric vehicle. By means of a characteristic curve and the measured power demand, the remaining available residual energy is determined first, and by means of the path covered in a previous driving time interval, conclusions are drawn concerning the remaining driving time.

German Patent Document DE 33 21 045 A1 discloses a device for determining the charge condition of a battery for an electric vehicle by measuring the battery temperature, the total battery voltage and the battery current. From these measured values, a microcomputer determines the drained charge as well as the remaining charge and from it determines the present charge storage capacity. This charge storage capacity is then used as the basis for determining the present charging condition.

German Patent Document DE 32 20 152 A1 discloses a battery charging device which contains a simple charge information system of the above-mentioned type, a control device for influencing the charging current as well as an input unit for putting in the available charging time. The user can choose between a charge time of eight, twelve or sixteen hours, and the charging current follows a diagram which is stored in a micromemory. At the start of the charging operation, this diagram is selected from a set of charging diagrams as a function of the existing charge condition and the selected charging time. Each charging diagram optimizes the charging efficiency for a full charge which is based on the present charging condition and stays within a given charging time.

The known battery charging device can be used to charge a traction battery of an electric or hybrid vehicle, in which case the ability to select a charging time, together with a conventional indication of the actual charging condition, represents a simple charge information system. However, the possibilities for adapting the charging operation to the wishes of the vehicle operator are very limited.

It is therefore an object of the invention to provide a charge information system which optimally supports the operator of an electric or hybrid vehicle during the input of the charging conditions.

This and other objects and advantages are achieved by the charge information and control system according to the invention, in which a microcomputer receives input information concerning, for example, the charge status of a vehicle battery, battery temperature, ambient temperature and the like. Additional battery charging parameters may be input by a vehicle operator, such as a desired charging time, a desired charge level or charging efficiency, maximum charging current, a desired vehicle speed, a desired driving range, etc. From these inputs, the computer calculates battery charging and vehicle operation information and displays it to the vehicle operator by means of a display unit. In addition, the computer may also select a suitable charging diagram to achieve the desired input parameters. The display of the required remaining charge time, in particular, is information which is important to the user because it makes it possible for him to adapt the charging of the battery optimally to the available time and to the requirements of the next driving use.

Other objects, advantages and novel features of the present invention will become apparent from the following detailed description of the invention when considered in conjunction with the accompanying drawings.

DETAILED DESCRIPTION OF THE DRAWINGS

Figure 1:
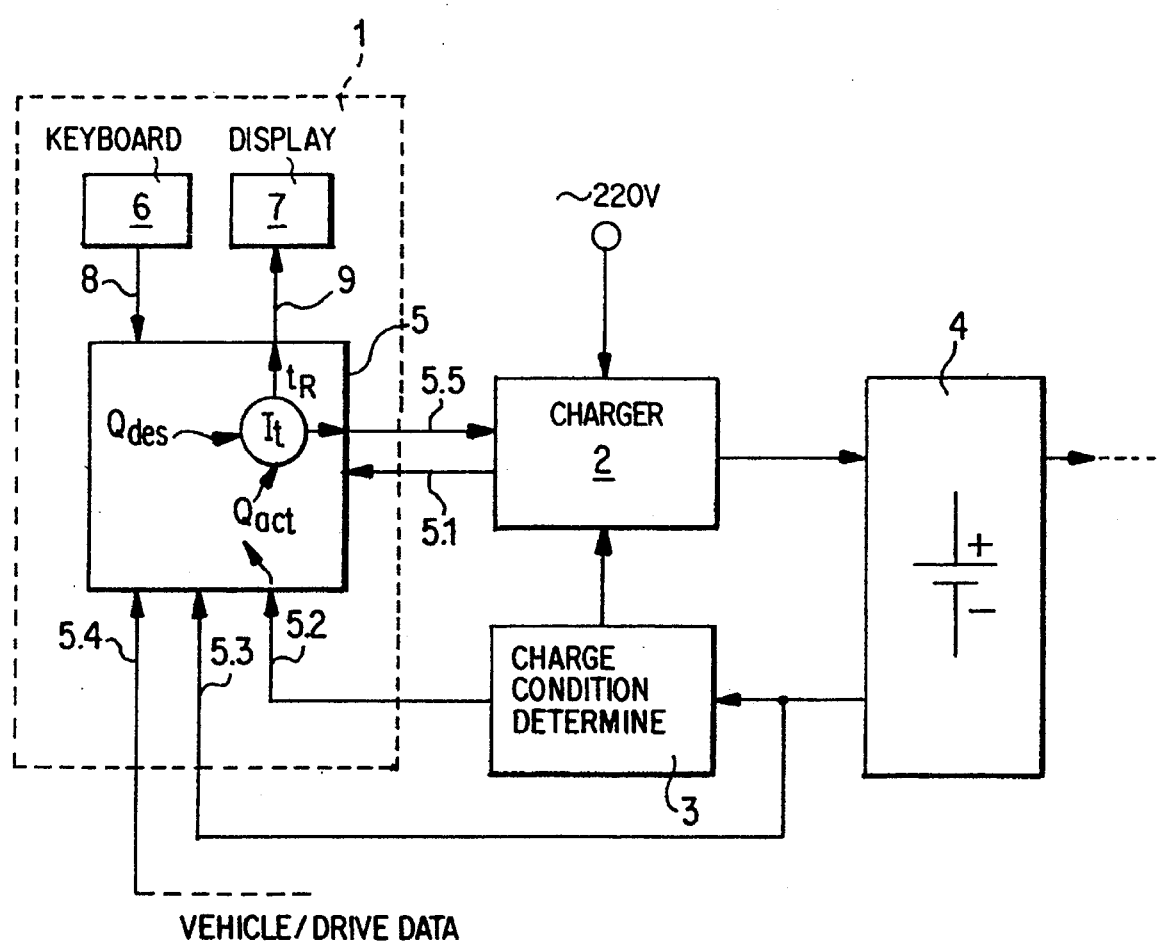
FIG. 1 is a block diagram of the charge information system 1 according to the invention.
Figure 2:
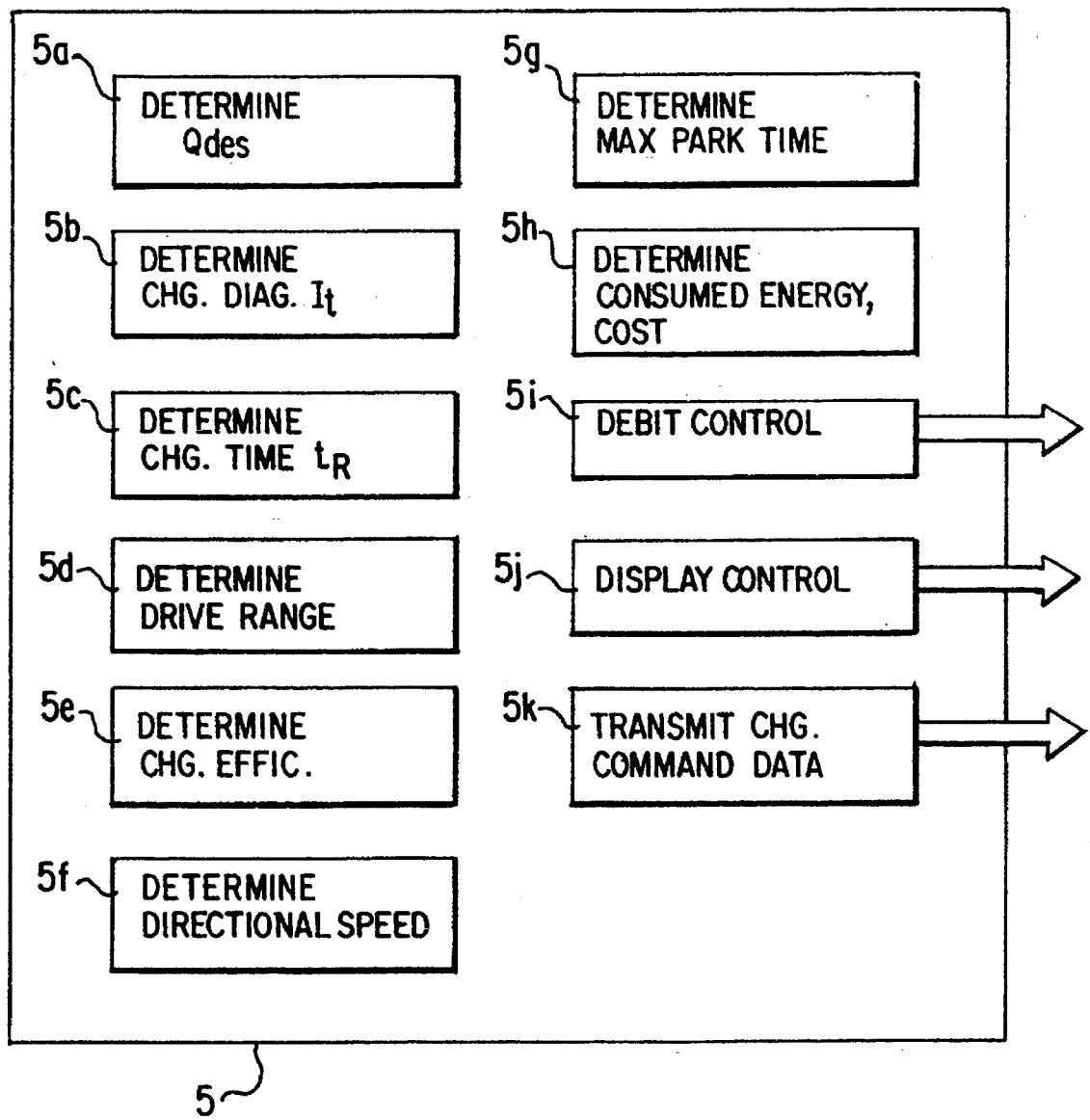
FIG. 2 is a more detailed functional block diagram of the computing unit 5 in FIG. 1.

As shown in FIG. 1, the charge information system 1 according to the invention comprises a microcomputer 5 which, by means of an input unit 6, such as a keyboard, receives data from a user and displays the desired information by means of a display unit 7. In addition to the input data, the microcomputer 5 also processes charger-related data 5.1 from the charger 2, charge condition data 5.2 from the charge condition determining device 3, additional battery-related data 5.3, such as the battery temperature, as well as vehicle-related and driving-condition-related data 5.4. The charger 2, charge condition detector 3 and other sensors for providing information to the microcomputer 5 are of a conventional type known to those skilled in the art. The computing unit 5 in FIG. 1 is programmed to perform a variety of calculations and controls 5a–5k, as shown in FIG. 2 and discussed in detail below.

The charging conditions fed via the input unit 6 can be transmitted by means of a data release command (for which, for example, a separate key may be provided on the keyboard) to the charger 2 as charge command data 5.5. Thus, the following sequence takes place for the user of the charge information system according to the invention: First, corresponding to his wishes, in a dialogue with the computer, the user sets the battery charging parameters 8 for the charging operation. After these have been found and displayed on the display unit, the user starts the charging operation by operating the data release key.

Various charging and operating parameters 8 can be entered via the input unit 6, and the different information can be requested to determine the charging operation. The important monitoring function is the display of the remaining required charging time $t_R$; that is, the time required to bring the battery from its present actual charging condition to a desired final charging condition, under defined charging parameters. As a rule, a full charge (100% nominal capacity) will be desired. For this reason, remaining charging time required to achieve a full charge will be displayed first if no other input takes place by the user. However, in the interest of more economical energy consumption, it is frequently preferable not to charge the battery completely to the full charge because, for many battery systems, the charging efficiency above 90% of the nominal capacity is substantially less than in the range of from 20% to 90%. Via the input unit 6, the user therefore also may indicate the desired charging efficiency (for example, 70%), whereupon the remaining charging time required for this purpose is displayed to him.

A simple algorithm for calculating the remaining charging time in the case of a constant charging current I is as follows: After the input of the charging efficiency, the desired charge $Q_{des}$ will be determined. The difference with respect to the actual charge $Q_{act}$, which is provided by the charging condition determining device 3, results in the charge amount $Q_{des}-Q_{act}$ to be charged. The remaining charging time $t_R$ is then obtained from the quotient:

$$t_R=(Q_{des}-Q_{act})/(I^* \eta_L)$$

wherein $\eta_L$ is the charging efficiency.

In the case of a variable charging current I which follows a selected stored charging diagram (such as the charging operation disclosed in German Patent Document DE 32 20 152 A1), the remaining charging time may be calculated as follows: First, the computer unit 5 determines the desired charge $Q_{des}$ as a function of the defining quantities 8, by using relationships which are known per se. Subsequently, the computing unit 5 determines a charging diagram $I_t$ for the time variation of the charging current I which relates to $Q_{des}$ and the actual charging condition $Q_{act}$, for example, by the selection of a stored charging diagram. As in the previously mentioned example, (in which the charging efficiency takes into account the characteristics of the battery 4), in this case the charging diagrams must be coordinated with the battery 4. The selection of the charging diagram may also be influenced by additional battery charging parameters 8, such as for example, a maximal charging current. On the basis of the selected charging diagram $I_t$, the computing unit 5 determines the required remaining charging time $t_R$ to complete the charging operation, and emits a corresponding signal 9 to the display unit 7 so that the remaining charging time $t_R$ is displayed.

In a further embodiment of the invention, in addition to the remaining charging time, the range of the electric-motor-driven vehicle which can be achieved by means of the selected charging efficiency, is also displayed. The range pertaining to the selected charging efficiency is determined by the computer from a corresponding characteristic range—charging efficiency curve in a manner that is known, per se.

Conversely, since the desired charging efficiency is a function of the desired range, it is also possible for the driver to enter a desired range value instead of the charging efficiency. Then, by using the above-mentioned characteristic range—charging efficiency curve, the computer first determines the required charging efficiency, and then determines the remaining charging time therefrom. In addition to the remaining charging time, the required charging efficiency may also be displayed.

Generally, the range which can be achieved by means of a particular charging efficiency depends on many factors, especially on the driving speed, so that the above-mentioned characteristic range -charging efficiency curve can apply only to standard conditions. Therefore, in a preferred embodiment, it is further provided that the driver can input driving conditions which deviate from the standard. The computer then selects from a family of characteristic range—charging efficiency curves, one which corresponds to the specific driving conditions, and uses it to calculate the range or the charging efficiency. In this case, the family of characteristic range—charging efficiency curves may be parameterized according to the following driving conditions: the intended average driving speed or directional speed, the number of occupants of the vehicle, traffic conditions (city traffic, mixed cross-country traffic, express highway), the topography (flat, hilly, mountainous), etc. Furthermore, the driver's individual vehicle handling style may be taken into account, which was previously identified and stored, for example, by means of a learning program, as known, for example, from automatic transmissions.

When the family of characteristic curves is parameterized at least according to the directional speed as described above, it may also be provided that, for a given charging efficiency and range, the recommended directional speed is determined by the computer and displayed. This directional speed should then be maintained by the driver in order to cover the given distance by means of the existing charge reserves. The charge reserves in this case may be based either on the desired charge reserves $Q_{des}$ or on the actual charging condition $Q_{act}$. Particularly the display of a directional speed based on the actual charge reserves $Q_{act}$ is a function which is advantageous for the driver of the electrically driven vehicle, not only during the charging but also during the drive. As a result, the driver receives information as to how fast he may drive in order to cover a certain distance (for example, to the nearest charging station). In this case, the directional speed is continuously adapted to the actual situation.

When the operator of the vehicle intends to park it for an extended period of time after a charging operation (for example, for several days), there is the risk that, because of the self-discharge of the battery and the discharge caused by connected continuous consuming devices, such as an antitheft warning system, the battery charge will be reduced to such an extent that the vehicle can no longer be driven by the electric motor. For this reason, the maximal parking duration (after the passing of which a certain distance of, for example, 10 km, to the nearest charging station can just barely be driven in the emergency operation), represents another important control quantity. Thus, it can be provided that, in addition to the range, the maximal parking duration is also calculated and displayed. In this case, a simple algorithm is supplied by the quotient of the charge and the self-discharging current.

Furthermore, in order to be able to charge by means of inexpensive night current, it is also useful to provide the start time and/or the end time of the charging operation can be input by the user. Expediently, these parameters 8 will be entered after the user has informed himself concerning the required remaining charging time, so that the charge time interval is not selected to be too brief.

Another useful control parameter which may be entered by the user is whether a quick charge is to be carried out because of a lack of time. A quick charge causes a higher charging current, and thus the charging efficiency is less favorable; also, depending on the charging process, it also causes faster aging of the battery. The standard is an economical, careful but longer-lasting charging. In addition, as noted previously, it is advantageous that the user can put in a maximal charging current, for example, to comply with a maximum current of a charging socket. The algorithm used for calculating the remaining charging time, and therefore the determined remaining charging time, are also based on this preliminary-decision for the charging current.

The algorithm for calculating the remaining charging time $t_R$ may be modified in a manner that is known per se in order to better model the battery operations, for example, by taking into account the influence of the battery temperature on the charging efficiency. To calculate the remaining charging time, in addition to the above-mentioned input data, the computer 5 may also receive the existing temperature conditions of the battery (battery-related data 5.3) and the outside temperature (driving-condition-related data 5.4) as well as the cooling outputs of the battery cooling and of the charge cooling. Thus, the lead time required to cool the battery sufficiently to start the charging operation may be calculated first. Subsequently, the charging operation will be precalculated, in which case the temperature course of the battery is also taken into account, which influences the charging efficiency and a possibly required charging current limitation. The temperature course of the battery in turn depends not only on the ohmic heat, but also on the current-dependent heat of reaction of the battery as well as the continuous cooling output.

The display unit 7 and the input unit 6 may advantageously be arranged in the interior of the vehicle in proximity to the driver. In addition, it is also useful for the information to be readable from outside the vehicle, for which purpose, the display may have such a large format and will be illuminated such that it can be inspected from the outside. Imaging in a window pane is also possible, or an external display unit may be provided, as, for example, behind the cover for the roll-out mechanism of the supply cable to the external socket. Furthermore, an external display may also be provided, for example, in the display field of a stationary charging station. In the latter case, the data transmission may take place via the socket and the supply network, via radio or other remote control systems; in this manner it is also possible to query from inside a house. A combination with the remote operating system for the auxiliary heater is also possible.

The display of other control quantities may also be included in the charge information system. For example, in addition to displaying the actual charge reserves $Q_{act}$, for the operational test of the charger, the previously consumed electric energy and the already run down charging time may also be queried. For the accounting with respect to outside charging stations, it is advantageous to make available a display of the energy costs in combination with a device for electronic debiting, for example, by means of a check card. In addition, it may be provided that, in the case of a faulty operation, an automatic display of the defect code takes place; for example, current source without voltage; battery too hot; battery defective; excessively high charging current, etc.

The charge information system supports the operator of the vehicle when he puts in the charge control parameters 8 at the start of a charging operation, during which the vehicle is parked and is connected to a charging station. The characteristics according to the invention in the case of a hybrid drive may easily also be applied to the conditions during a combustion engine drive while the battery is charged at the same time. The charging current which can be supplied by the generator will then enter into the calculation of the remaining charging time.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Charge information system for an electric or hybrid vehicle having a vehicle battery, comprising:

a battery charger;

a unit for determining charge condition of said battery;

an input unit for entering charging and operating parameters of the charging operation; and a computing unit coupled to receive inputs from said battery charger and said unit for determining charge condition, as well as charging and operating parameters from said input unit, said computing unit comprising:

means for determining a desired charge $Q_{des}$ as a function of the input charging parameters;

means for determining a charging diagram $I_t$ for the course of a charging current I over time, based on the input charging parameters and an actual charge condition $Q_{act}$;

means for determining a required remaining charging time $t_R$ for the implementation of the charging operation, based on the selected charging diagram $I_t$; and means for controlling a display unit by means of a signal for the remaining charging time $t_R$.

2. Charge information system according to claim 1, wherein said input unit further comprises means for inputting a data release command; and wherein said computing unit further comprises means responsive to said data release command for transmitting to said battery charger, a set of charging command data which correspond to a most recently entered set of charging parameters, whereby a corresponding charging operation is initiated.

3. Charge information system according to claim 1, wherein one of said charging parameters is a desired charging efficiency.

4. Charge information system according to claim 1, wherein said computing unit further comprises means to determine and display an achievable driving range as a function of the charging parameters, based on a defined relationship between charging reserves and the driving range.

5. Charge information system according to claim 1, wherein:

one of said charging parameters is a desired range of the vehicle; and the computing unit further comprises means to calculate required charging efficiency, based on a defined relationship between the charging reserves and the driving range.

6. Charge information system according to claim 1, wherein said computing unit further comprises means to determine and display a required or achievable charging efficiency, as a function of the input charging parameters.

7. Charging information system according to claim 5, wherein said computing unit further comprises means to determine and display a required or achievable charging efficiency, as a function of the input charging parameters.

8. Charge information system according to claim 4, wherein said charging parameters further comprise information concerning deviations from the standard conditions, including at-least one of a medium driving speed and a directional speed, on which the relationship between the charging reserves and the range is based.

9. Charge information system according to claim 8, wherein the computing unit further comprises means to determine and display a directional speed as a function of a given driving range and present or desired charging reserves.

10. Charge information system according to claim 1, wherein one of said charging parameters is a maximal charging current.

11. Charge information system according to claim 1, wherein the computing unit further comprises means to determine maximal parking duration based on present or desired charging reserves and a defined self-discharging.

12. Charge information system according to claim 1, wherein said input unit further comprises means for inputting at least one of: a start time and an end for the charging operation.

13. Charge information system according to claim 1, wherein further comprising a data display and data input which may be carried out outside the vehicle by data transmission.

14. Charge information system according to claim 1, wherein said computing unit further comprises means to determine and display at least one of: consumed electric energy and the corresponding energy costs.

15. A charge information system according to claim 14 wherein said computing unit further comprises means for debiting the displayed energy costs.

* * * * *